United States Patent
Colgan et al.

(10) Patent No.: US 7,001,498 B2
(45) Date of Patent: Feb. 21, 2006

(54) ELECTROPLATING APPARATUS AND FOUR MASK TFT ARRAY PROCESS WITH ELECTROPLATED METAL

(75) Inventors: Evan George Colgan, Chestnut Ridge, NY (US); John Christopher Flake, Mohegan Lake, NY (US); Lubomyr Taras Romankiw, Briarcliff Manor, NY (US); Robert Luke Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 10/268,633

(22) Filed: Oct. 10, 2002

(65) Prior Publication Data

US 2003/0038037 A1 Feb. 27, 2003

Related U.S. Application Data

(62) Division of application No. 09/563,442, filed on May 1, 2000, now Pat. No. 6,495,005.

(51) Int. Cl.
  *C25D 5/04* (2006.01)
(52) U.S. Cl. ............... 205/133; 205/117; 205/118; 205/122; 205/123
(58) Field of Classification Search ........... 205/117, 205/118, 123, 128, 136, 137, 147, 668, 686, 205/122, 133; 204/222, 224 R
See application file for complete search history.

(56) References Cited

U.S. PATENT DOCUMENTS

| | | | | |
|---|---|---|---|---|
| 3,468,785 A | * | 9/1969 | Polichette | 204/224 R |
| 4,376,683 A | * | 3/1983 | Hellwig et al. | 205/133 |
| 5,270,229 A | * | 12/1993 | Ishihara | 438/158 |
| 6,143,155 A | * | 11/2000 | Adams et al. | 205/87 |
| 6,547,937 B1 | * | 4/2003 | Oberlitner et al. | 204/224 R |
| 6,586,766 B1 | * | 7/2003 | Yamazaki et al. | 257/57 |

* cited by examiner

Primary Examiner—Roy King
Assistant Examiner—William T. Leader
(74) Attorney, Agent, or Firm—Robert M. Trepp; F. Chau & Associates, LLC

(57) ABSTRACT

An electroplating apparatus, in accordance with the present invention, includes a plurality of chambers. A first chamber includes an anode therein. The first chamber has an opening for delivering an electrolytic solution containing metal ions onto a surface to be electroplated. The surface to be electroplated is preferably a cathode. A second chamber is formed adjacent to the first chamber and has a second opening in proximity of the first opening for removing electrolytic solution containing metal ions from the surface to be electroplated. The plurality of chambers are adapted for movement in a first direction along the surface to be electroplated.

26 Claims, 8 Drawing Sheets

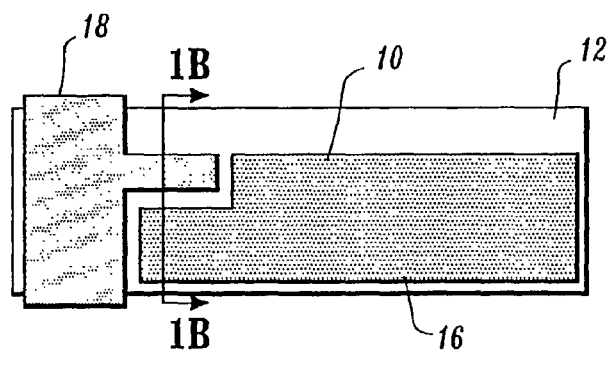
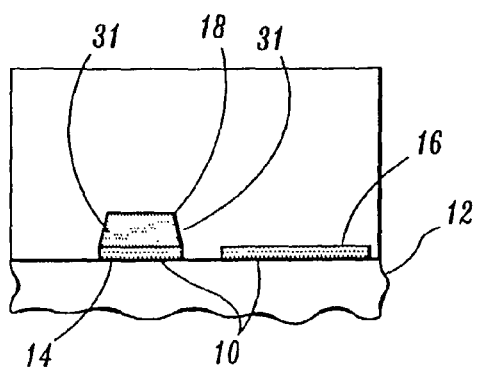
FIG. 1A  FIG. 1B
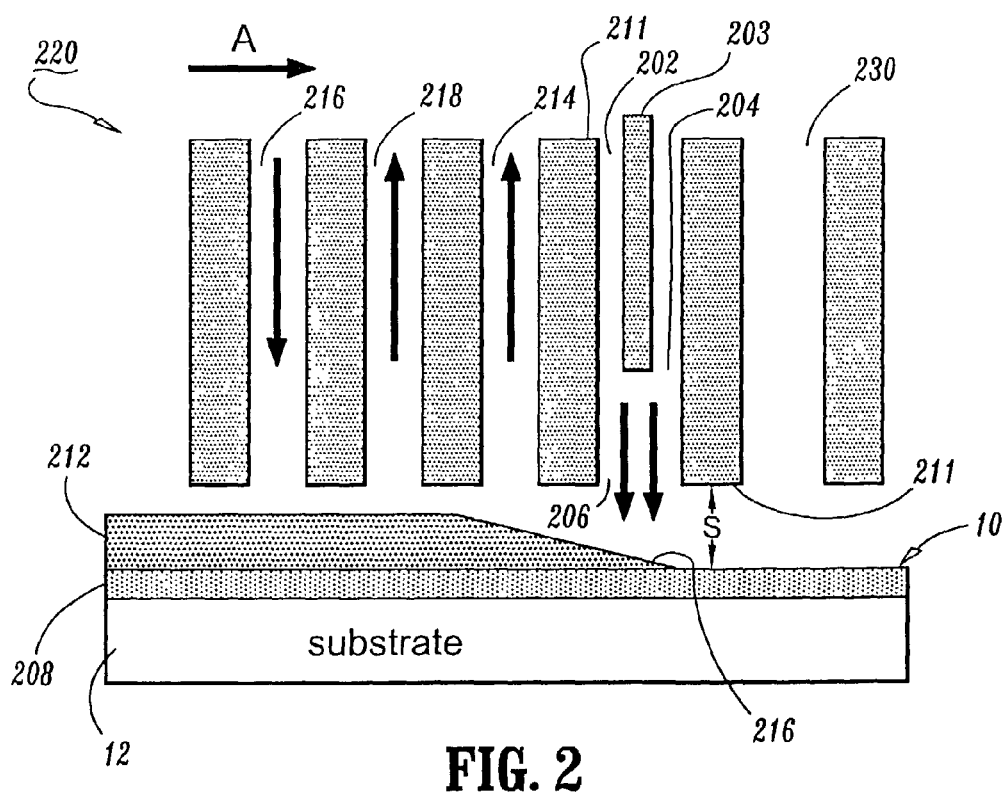
FIG. 2

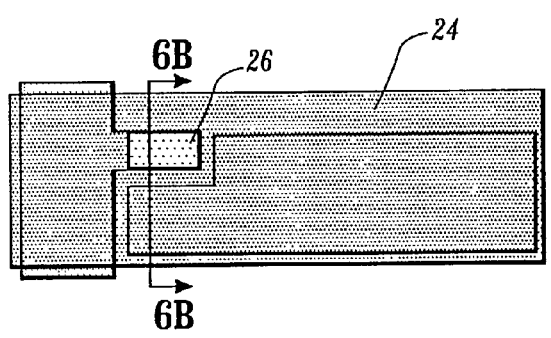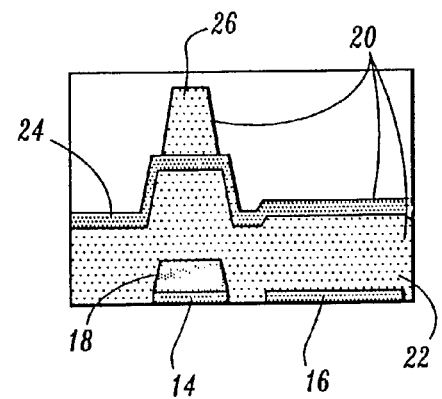
FIG. 6A　　　　　　　　FIG. 6B
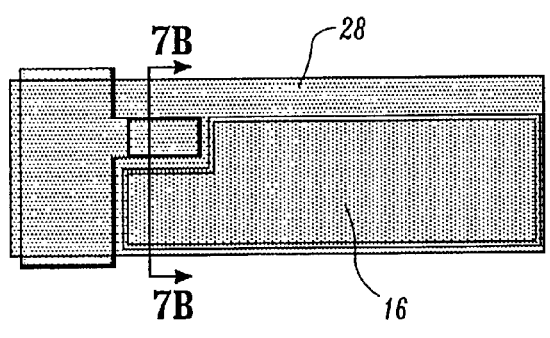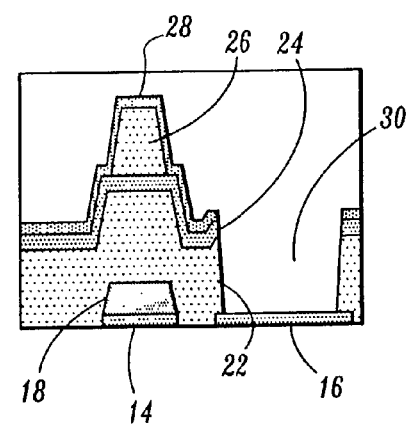
FIG. 7A　　　　　　　　FIG. 7B

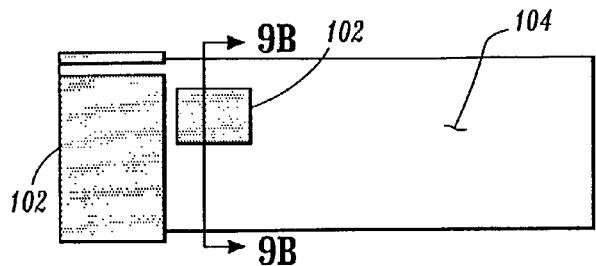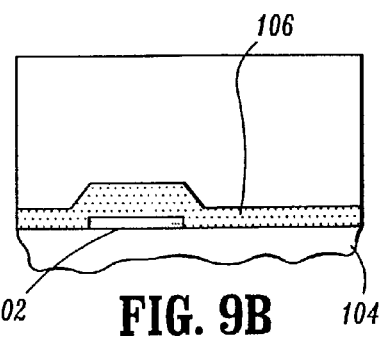
FIG. 9A FIG. 9B
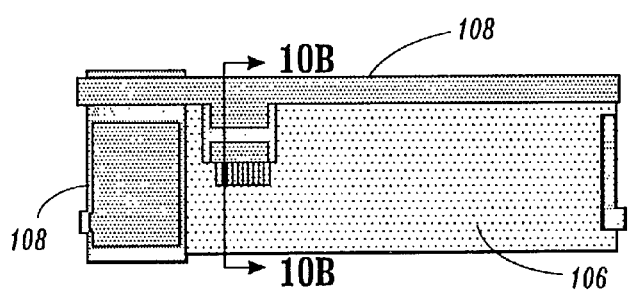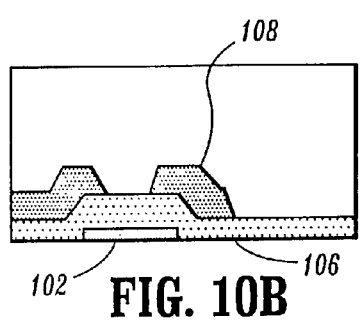
FIG. 10A FIG. 10B
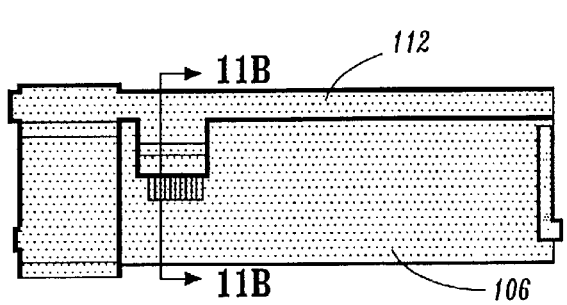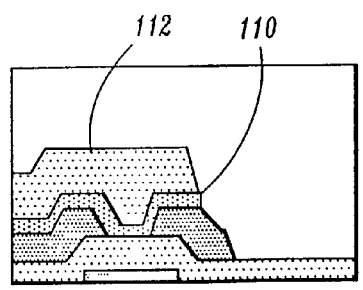
FIG. 11A FIG. 11B
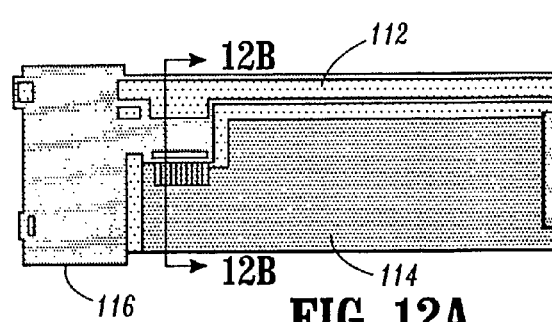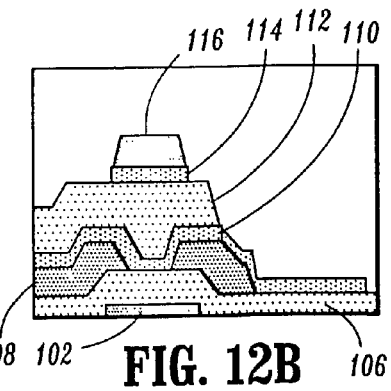
FIG. 12A FIG. 12B

ELECTROPLATING APPARATUS AND FOUR MASK TFT ARRAY PROCESS WITH ELECTROPLATED METAL

CROSS-REFERENCE-TO RELATED APPLICATION

This application is a divisional of U.S. application Ser. No. 09/563,442 filed on May 1, 2000, now U.S. Pat. No. 6,495,005, the disclosure of which in its entirety is incorporated by reference herein.

BACKGROUND OF THE INVENTION

1. Field of the Invention

The present invention relates to electroplating devices, and more particularly to a method for fabricating a thin film transistor array for a liquid crystal display with an electroplated gate or data metal.

2. Description of the Related Art

Displays, such as, liquid crystal displays, have found a wide range of uses in modern electronic equipment. With the improvement of viewing quality and the reduction of viewing angle limitations, liquid crystal displays have become more appealing for a plurality of new applications and well as more desirable for old applications. In many instances, liquid crystal displays are replacing cathode ray tube (CRT) displays. For example, liquid crystal displays are now being employed for computer monitors.

Liquid crystal displays, in many applications, provide desirable features, such as light weight, low profile and low power, to name a few. Due to increased usage of liquid crystal technology, there is a large driving force to reduce the costs of such displays. One way to reduce the costs of liquid crystal displays is to reduce the number of processing steps needed to fabricate these devices. For example, many liquid crystal display thin film transistor TFT arrays are fabricated in processes which include a plurality of masking steps. It would be advantageous to reduce the number of masking, deposition, and etching steps used to build these TFT arrays. The industry is currently moving to five mask processes, but it is desirable to reduce the number further to four mask steps, Therefore, a need exists for a method for fabricating a TFT array in less than five masking steps. A further need exists for providing a display device produced by this method which includes an electroplated gate or data metal, since metal deposition by electroplating is lower cost then conventionally employed sputtering processes.

SUMMARY OF THE INVENTION

An electroplating apparatus, in accordance with the present invention, includes a plurality of chambers. A first chamber includes an anode therein. The first chamber has an opening for delivering an electrolytic solution containing metal ions onto a surface to be electroplated. The surface to be electroplated is preferably a cathode. A second chamber is formed adjacent to the first chamber and has a second opening in proximity of the first opening for removing electrolytic solution containing metal ions from the surface to be electroplated. The plurality of chambers are adapted for movement in a first direction along the surface to be electroplated.

In alternate embodiments, the plurality of chambers may include a rinse chamber including a supply of water for rinsing the surface, and/or a pretreatment chamber which leads the first chamber for pretreating and cleaning the surface to be electroplated. The surface to be electroplated preferably includes conductive lines, although other features may be plated as well. The conductive lines may extend longitudinally along the first direction. The conductive lines preferably connect to a common node. The apparatus may include a plurality of first chambers and a plurality of second chambers. The anode may include a consumable metal anode. The anode may include an inert metal and the electrolyte solution may include ions of a metal to be deposited. The first chamber may be surrounded by the second chamber, for example in a pipe within a pipe arrangement. The pipes may be of any shape, for example circular in cross-section, or rectangular in cross-section or combinations thereof. The second chamber may include a plurality of chamber which surround the first chamber.

A method for forming an electroplated metal on conductive layers, in accordance with the present invention, includes the steps of providing a substrate having elongated conductive structures formed thereon, providing an electroplating apparatus including a plurality of chambers, a first chamber including an anode therein, the first chamber including a first opening for delivering an electrolytic solution containing metal ions onto the conductive structures to be electroplated, the conductive structures being a cathode, and a second chamber formed adjacent to the first chamber and having a second opening in proximity of the first opening for removing electrolytic solution containing metal ions from the conductive structures to be electroplated and moving the plurality of chambers in a first direction along the conductive structures to be electroplated to electroplate the metal onto the conductive structures.

In other methods, the plurality of chambers may include a rinse chamber, and the method may further include the step of rinsing an electroplated surface of the conductive structures. The plurality of chambers may include a pretreatment chamber which leads the first chamber, and the method may further include the steps of pretreating and cleaning the conductive structures to be electroplated. The conductive structures may include gate of data lines for active devices. The conductive structures may extend longitudinally along the first direction. The conductive structures may connect to a common node during electroplating. The electroplating apparatus may include a plurality of first chambers and a plurality of second chambers, and the method may further include the step of incrementally electroplating the conductive structures with each of the plurality of first chambers.

In still other methods, the anode may include a consumable metal anode or the anode may include an inert metal and the electrolyte solution may include ions of a metal to be deposited. The step of providing an electroplating apparatus may include the step of providing the apparatus in which the first chamber is surrounded by the second chamber.

A method for fabricating an active array for a liquid crystal display device, in accordance with the present invention, includes the steps of forming addressing lines for the active array, providing an electroplating apparatus including a plurality of chambers, a first chamber including an anode therein, the first chamber including a first opening for delivering an electrolytic solution containing metal ions onto the addressing lines to be electroplated, the addressing lines being a cathode, and a second chamber formed adjacent to the first chamber and having a second opening in proximity of the first opening for removing electrolytic solution containing metal ions from the addressing lines to be electroplated, and moving the plurality of chambers in a first direction along the addressing lines to be electroplated to electroplate the metal onto the addressing lines.

The addressing lines may include indium tin oxide or indium zinc oxide. The addressing lines may extend longitudinally along the first direction. The addressing lines may connect to a common node during electroplating. The methods may further include the steps of forming access devices for accessing pixel electrodes through the addressing lines and forming data lines for addressing the pixel electrodes. The addressing lines may be included in a top gate structure or a bottom gate structure. The method is preferably performed in only four masking steps. The method may further include the step of forming access devices for accessing pixel electrodes through gate lines, where the addressing lines are for addressing the pixel electrodes. The active array may include conductive structures isolated from the cathode such that electroplating is prevented on the conductive structures. The conductive structures may include pixel electrodes.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIG. 1A is a top view of a single pixel cell having an electroplated gate metal in accordance with the present invention;

FIG. 1B is a cross-sectional view of the pixel cell taken at section line 1B—1B of FIG. 1A in accordance with the present invention;

FIG. 2 is a cross-sectional view of an electroplating apparatus in accordance with the present invention;

FIG. 6A is a top view of the single pixel cell of FIG. 1A having an a tri-layer insulator applied and patterned in accordance with the present invention;

FIG. 6B is a cross-sectional view of the pixel cell taken at section line 6B—6B of FIG. 6A in accordance with the present invention;

FIG. 7A is a top view of the single pixel cell of FIG. 6A having an a semiconductor layer applied and patterned in accordance with the present invention;

FIG. 7B is a cross-sectional view of the pixel cell taken at section line 7B—7B of FIG. 7A in accordance with the present invention;

FIG. 9A is a top view of a single pixel cell having a light shield formed and patterned in accordance with the present invention;

FIG. 9B is a cross-sectional view of the pixel cell taken at section line 9B—9B of FIG. 9A after being overcoated with an insulator in accordance with the present invention;

FIG. 10A is a top view of the single pixel cell of FIG. 9A having a data metal formed and patterned in accordance with the present invention;

FIG. 10B is a cross-sectional view of the pixel cell taken at section line 10B—10B of FIG. 10A in accordance with the present invention;

FIG. 11A is a top view of the single pixel cell of FIG. 10A having a semiconductor material and an insulation layer and patterned in accordance with the present invention;

FIG. 11B is a cross-sectional view of the pixel cell taken at section line 11B—11B of FIG. 11A in accordance with the present invention;

FIG. 12A is a top view of the single pixel cell of FIG. 11A having a transparent conductor and an electroplated metal formed and patterned in accordance with the present invention;

FIG. 12B is a cross-sectional view of the pixel cell taken at section line 12B—12B of FIG. 12A in accordance with the present invention;

DESCRIPTION OF PREFERRED EMBODIMENTS

Figure 3:
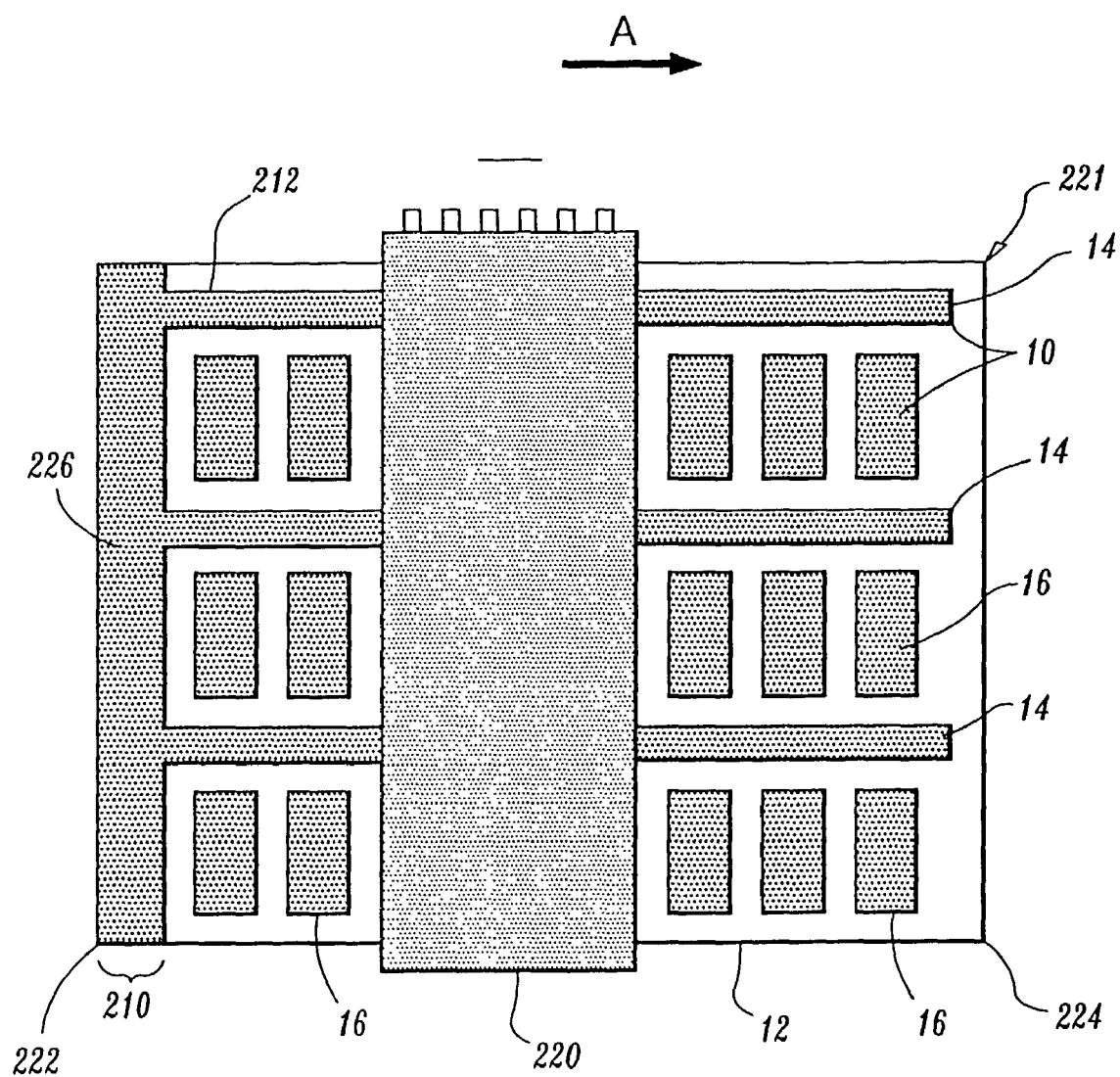
FIG. 3 is a top view of the electroplating apparatus of FIG. 2 for plating gate lines in an array of pixels in accordance with the present invention.

The present invention relates to electroplating devices, and more particularly to an improved fabrication method which produces a thin film transistor array for liquid crystal display devices in four masking steps. The present invention also provides a method and tool for forming an electroplated metal layer for a gate used for the thin film transistors in the array.

A method for a four mask thin film transistor (TFT) array process with an electroplated gate metal will now be described in greater detail. The present invention will be described in terms of a liquid crystal structure which may include active matrix displays. Other display structures, as well as, other device structures may also find utility in/with the present invention.

Referring now in detail to the figures in which like numerals represent the same or similar elements and initially to FIGS. 1A and 1B, a transparent conductive layer is formed on a substrate 12. Transparent conductive layer 10 may include materials such as, for example, indium tin oxide (ITO), indium zinc oxide (IZO) or the like. Substrate 12 may include glass, quartz, a polymer or other transparent substrate material. Transparent conductive layer 10 is deposited and patterned to form gate lines 14 and pixel electrodes 16 for a liquid crystal display 8.

A metal layer 18 is formed on gate lines 14. Metal layer 18 is preferably formed by electroplating. Metal layer 18 is employed to selectively coat gate line 14 with a metal, such as, for example, Ni, Au, Co, Cu, Ag, alloys of these metals or other metals or metal alloys to reduce gate metal resistance. Advantageously, gate lines 14 are continuous across substrate or plate 12, and all gate lines 14 can be accessed along one edge of substrate 12 and electrically contacted for an electroplating process as will be described below. A contact (not shown) can later be cut, for example, during dicing of substrate 12. Pixel electrodes 16 are each electrically isolated. Since no potential is applied to pixel electrodes 16 during electroplating, pixel electrodes 16 will not have any metal electroplated thereon.

A novel plating technique is preferably employed to deposit a uniform layer of metal along gate lines 14 due to the high resistance (of gate lines 14). Since gate lines 14 are electrically conducting, it is possible to make an electrical connection to gate line 14, and to electroplate copper, nickel, cobalt, gold, silver, alloys of these metals or any other metal or metal alloys thereon.

One difficulty using conventional techniques is that all commonly used plating solutions are highly electrically conducting and the current flowing from an anode through the body of the solution to the transparent conductive material of gate lines 14 (cathode) will be diverted to an area near or closer to which the electrical contact is made. The plating will start at this point, but because the transparent conductive layer 10 (such as an ITO layer or even a thin metal pattern) is not sufficiently conducting, the depositing metal front will be moving only very slowly along the length of the pre-patterned gate lines 14. The thickness uniformity even on top of a pre-patterned gate lines 14 would be unacceptable. Due to higher conductivity, the metal deposited near the cathode contact point will continue thickening while the plating along the length of the gate line 14 will proceed extremely slowly. As a result, ITO conductors even on a small plate of glass will have an extremely non-uniform thickness profile. So far there have been no literature reports which would show that a uniform thickness of metal can be obtained by electroplating on very thin pre-patterned metal conductors or on ITO.

When it is desired to produce metal patterns by electroplating in accordance with the prior art, a conventional dielectric substrate is metallized with a thin continuous highly conductive film, the substrate is then coated with a photo-resist. After exposure and development, the substrate is electroplated through a resist mask, the resist mask is removed, and the thin metal seed layer is removed by chemical etching, sputter etching, reactive ion etching (RIE), or ion milling.

Referring to FIG. 2, to overcome this problem of the prior art and to cut back on the number of process steps, a closed anode compartment or chamber 202 on an electroplating apparatus or composite cell 220 is employed with a narrow slit or nozzle 204 through which a fresh plating solution and electrical current are supplied. An anode 203 may be an inert metal, such as, for example, platinum or titanium or a consumable metal, such as, for example, Cu, Ni, Au, Co, Ag and/or alloys of these metals that supplies metal in solution to be electro-deposited on a surface to form metal layer 212. If an inert anode is employed, the metal (e.g., Cu, Ni, Au, Co, Ag, alloys of these metals, etc.) is supplied as ions in the electrolyte solution.

It is to be understood that consumable anodes need to be continuously fed to maintain the anode to cathode distance. When used up, the consumable anodes need to be replaced with new anodes. For inert anode, appropriate measures should be taken to account for the generation of oxygen gas ($O_2$) during plating and prevent the generation of oxygen bubbles from interfering with electrolyte flow and the metal ion reduction process at the cathode. In one embodiment, linear and volumetric solution flow past the anode is very fast so that oxygen has no time to form and very little dilution of the plating solution takes place. In another embodiment, the rate of oxygen generation is maintained at a low enough rate such that generated oxygen is soluble in the electrolyte solution. In yet another embodiment, anode area is large so that oxygen gas bubbles do not form on the anode.

It is further to be understood that slit or nozzle 204 may represent a slit-type tool or an annular nozzle. In one example, the slit-type tool may include a plurality of slits (e.g., square shaped channels) where a first slit include the anode and an adjacent slit provide an electrolyte return path. Other slit-type designs are also contemplated. One example of a nozzle type tool may include an annular structure with an inner tube including the anode and an outer annulus chamber(s) for return flow (or vice versa).

In one embodiment, a separate anode may be eliminated by making chamber walls 211 from an anodic material (inert or consumable). Alternately, anode(s) may be embedded in chamber walls 211.

A separation S between an opening 206 of slit 204 and conductive material 208, for example, transparent conductive layer 10, which may include ITO, is very small. For example, the separation S may be as small as or smaller than one millimeter. This separation S depends on layer 10 conductivity pattern density, solution conductivity and pattern resolution desire.

Referring to FIGS. 2 and 3, anode compartment 202 is scanned along the length of conductive material 208, for example, gate lines (or data lines) 14, starting from a point of electrical contact 210. Scanning rate depends on factors such as current density and mass transport rate. These factors may be controlled with parameters, such as, current flow and electrolyte flow/composition to yield desired thicknesses, tapers, etc. In the arrangements described in the invention, as soon as the desired thickness of metal 212 (e.g., copper, nickel, cobalt, gold, silver and/or alloys of these metals, etc.) is electroplated, a supply of the plating solution and of the electrical current is cut off to the plated section of gate line 14 by the motion of the composite cell 220. FIG. 2 shows a possible solution supply nozzle/water rinse arrangement. This is one of the many possible arrangements. It is also possible to envision a more complex arrangement including several such nozzles following each other and either thickening the electro-deposited metal or over-coating it with a protective layer of another metal or similar materials. If the conducting lines are plated using metals, such as, Ni or Co, no cladding may be needed. If the conducting lines are plated with metals, such as, Cu, Au, Ag, (or alloys thereof), the metals may need to be clad (covered) with a either a barrier, such as, a metal or an adhesion metal layer (e.g., Ni on top of Au). This barrier may be plated using, for example, a second pass (or a second scanner of the same composite cell) of the electroplating apparatus of the present invention. The barrier may also be deposited using electroless (dip) techniques. An electroplated barrier may include, for example, Ni, Co, NiCo or Cr. An electrolessly deposited barrier may include, for example, Ni, Co or alloys thereof, such as NiP, CoP, CoWP, CoSnP, etc.

As shown in FIG. 2, one slit (nozzle) 204 is used to provide the plating solution, while an adjacent slit 214 is used to quickly withdraw the fluid. The plating solution and hence the electrical current make contact only over a very short length of gate lines. This permits the advance of a plating metal front 216 while making a low resistivity electrical contact through the already metal-plated conductive line 208. The thickness of the deposit will be determined by the concentration of the plating solution, the separation between the two slits (204 and 214) (solution entry and solution exit), the local current density and the rate at which anode compartment 202 is moved relative to the gate line 14. The direction of motion in the illustrative example, shown in FIGS. 2 and 3, is indicated by arrow "A".

To make sure that salt residue does not get left behind to start a corrosion process, plating nozzle or slit 204 and suction nozzle or slit 214 are followed by a water rinse nozzle 216 and an additional suction-drying nozzle 218 (nozzles 216 and 218 may be reversed). A pretreatment/ cleaning chamber 230 may be provided for preparing the surface to be electroplated. Cleaning/pretreatment may include a rinse with water or water with detergent or a soluble organic solvent such as, ethanol, or acetone. Chamber 230 may include a supply slot and a suction slot to deliver and remove cleaning/pretreatment materials.

Referring again to FIG. 3, a "plating/drying/rinsing/drying" combination cell 220 is scanned over gate line 14 from a first edge 222 to an opposite edge 224 of an active matrix array 221 on substrate 12. Array 221 includes pixel electrodes 16. The scanning is started from end 222 of substrate 12 which electrically connects to gate lines 14 or other conductive structures.

In the illustrative embodiment shown in FIG. 3, a shorting bus 226 is patterned along with gate lines 14 and functions as a connection point and a cathode for electroplating gate lines 14. Advantageously, gate lines 14 are continuous across substrate or plate 12, and all gate lines 14 can be accessed along edge 222 of substrate 12 and electrically contacted for the electroplating process by employing shorting bus 226. Shorting bus 226 can later be cut off, for example, during dicing of substrate 12 or etched away. After beginning the scanning of cell 220 at the contact point 226, scanning continues to the unconnected end 224 along the length of gate lines 14 (in the direction of arrow "A").

For best uniformity of deposited metal thickness, it is preferred that slit 204, supplying the solution, always moves at about a right angle to the length of gate lines 14. One skilled in the art would understand that if a thickness variation were desired along the length of gate lines 14, it would be possible to achieve this by modulating the current, scan speed, rate of supply of electrical current or solution concentration to locally thin down or thicken the lines. It is further noted that pixel electrodes 16 are electrically isolated from gate lines 14, shorting bus (cathode) 226 and each other. Therefore, pixels electrodes 16 are not affected by the electroplating process.

Another advantage of forced-electrolyte plating, as shown in FIGS. 2 and 3, in accordance with the present invention, of transparent electrode materials (IZO or ITO) is that the profile of the deposited metal film may be controlled by the design and operation of the plating assembly (e.g., cell 220).

Since the plating assembly or cell 220 (FIG. 2) may be operated in either a mass transfer-limited regime or a kinetic-potential (cathode-anode) limited regime, a taper 31 (FIG. 1B) may be controlled by altering the geometry of the plating nozzle 204 or the conditions of operation such as scanning rate, flow rate, pressure, electrolyte composition, and temperature. To further control taper 31 (FIG. 1B) and ensure uniform thickness of the electroplated layers, the finished electroplated materials of taper 31 (FIG. 1B) may be plated/etched using conventional techniques (e.g., submerged in liquid electrolyte). Electrical connections for further plating of metal 212 may be made in the same fashion as used in the forced-electrolyte technique described for FIG. 3. The control of potential and electrolyte composition may be optimized to achieve uniform metal films with tapered edges 31.

The present invention has been described illustratively for a situation in which ions are supplied only through one slotted assembly (e.g., slit 204), it is, however, contemplated that the plating apparatus may include a plurality of slotted assemblies following each other. Each slotted assembly may build up slightly more thickness of the plated metal line or may deposit a barrier protective layer, for example, Co, Cr or Ni.

Figure 4:
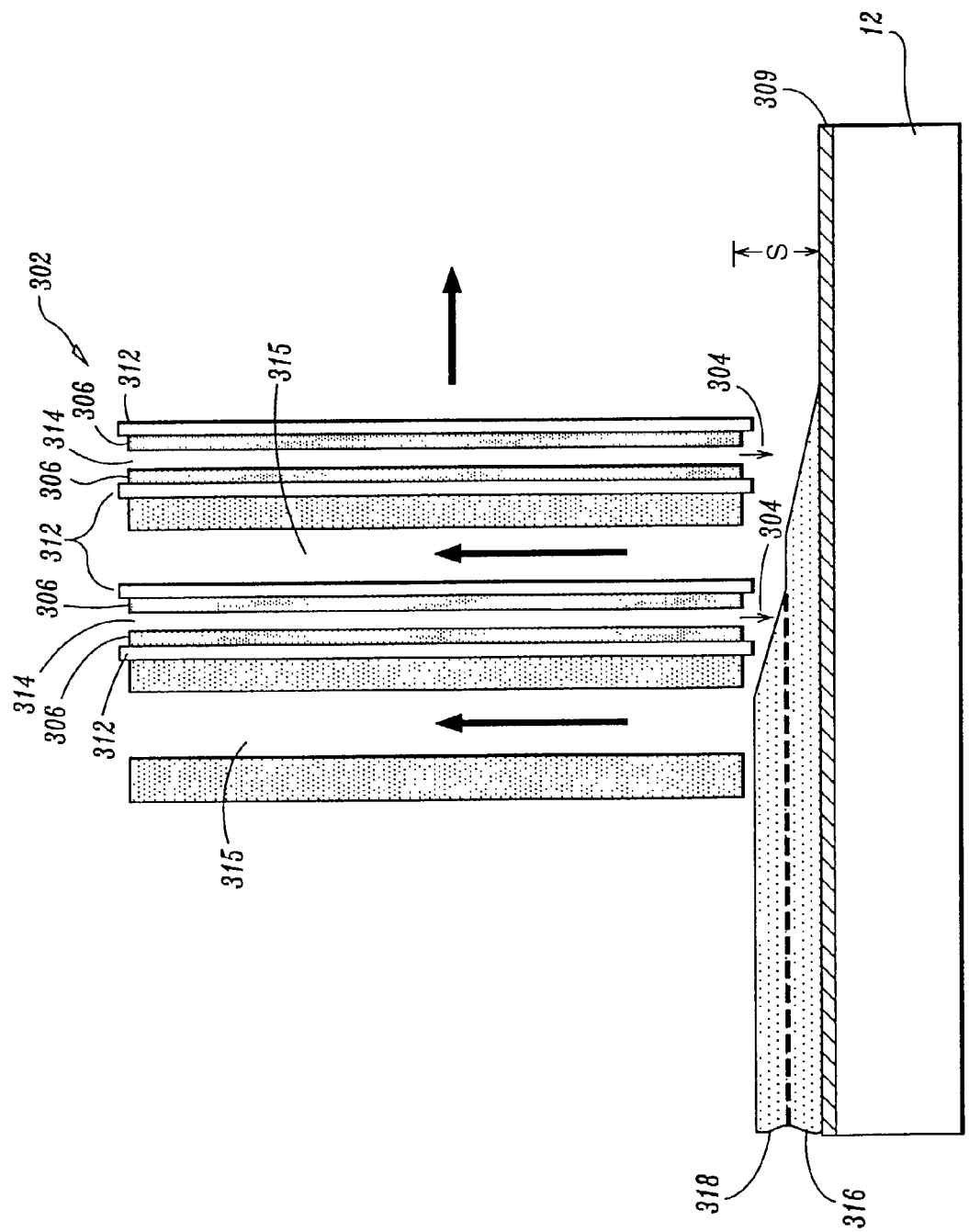
FIG. 4 is a cross-sectional view of another electroplating apparatus in accordance with the present invention showing multiple metal layers being electroplated in a single pass.

Referring to FIG. 4, an electroplating tool 302 may be employed in which a plating solution 304 and an anode 306 are scanned over conductive lines or conductive patterns 309, for example, gate lines 14. In one embodiment, anode 306 may include a hollow conductive carbon or insoluble (inert) metal rod wrapped with a lintless cloth or a porous polymer 312. Plating solution 304 may be supplied through a cavity 314 inside of anode rod 306 and lintless cloth or porous polymer 312 may slide over in contact with the patterned conductive layer 309 (which are preferably connected in a cathode mode) or gapped to provide a distance S. With this method the viscosity of the plating solution may need to be increased to achieve the desired thickness uniformity. FIG. 4 shows suction chambers 315 for removing solution 304 after electroplating layers 316 and 318. FIG. 4 shows apparatus 302 with two supply slots through cavities 314 of anodes 308 and two return slots 315. Other embodiments may include one supply and one return slot or multiple supply and return slots. In still other embodiments rinsing and pretreating chambers may be included.

Figure 5:
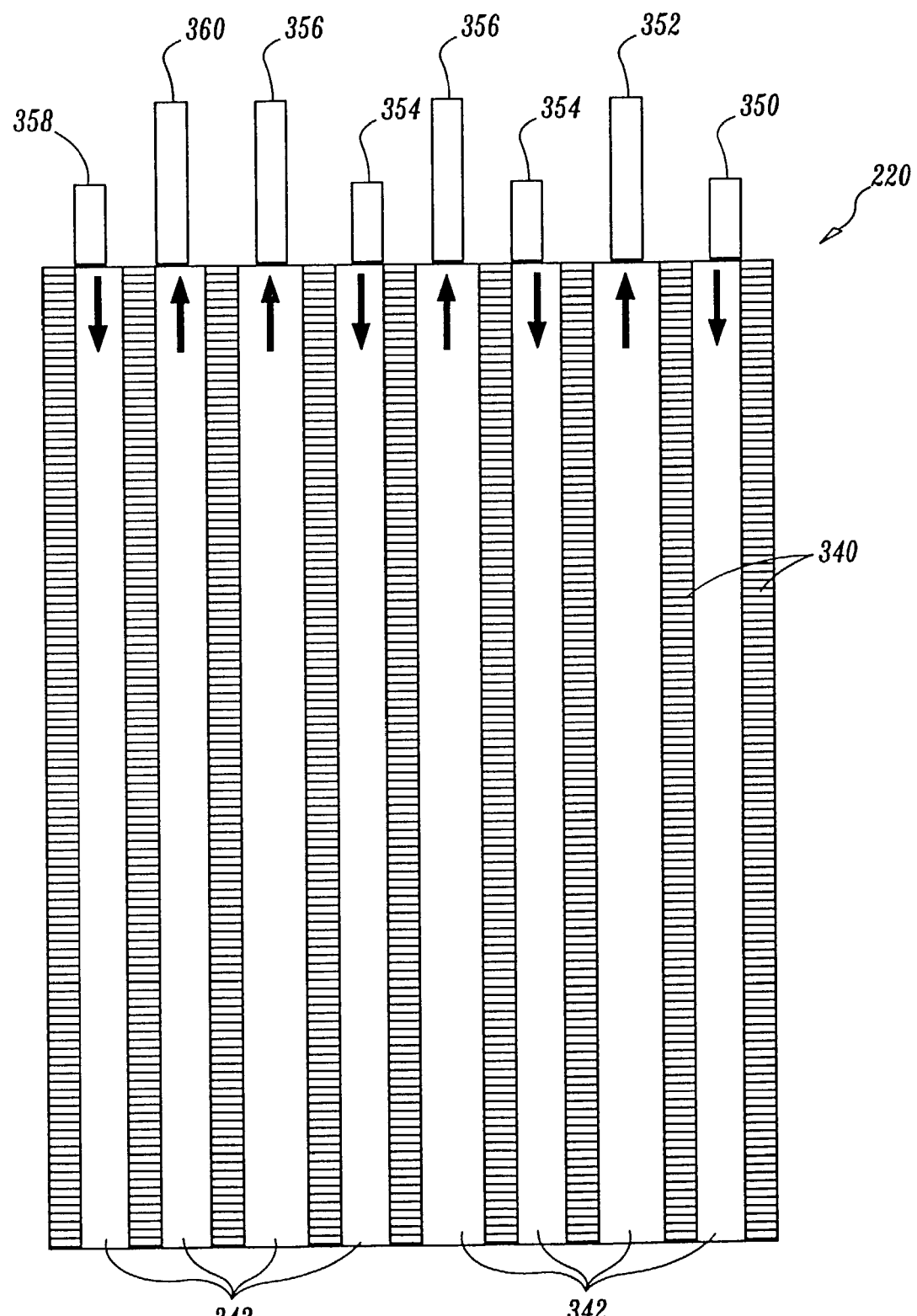
FIG. 5 is a cross-sectional view of an electroplating apparatus showing supply and return lines in accordance with the present invention.

Referring to FIG. 5, a schematic diagram of one embodiment of an electroplating apparatus of the present invention, e.g., apparatus 220 or 302, is illustratively show. Walls 340 form chambers 342 through which fluids flow for electroplating, rinsing and pretreating conductive structures. Supply line 350 provides pretreatment/cleaning fluid which is subsequently removed by return line 352. Supply lines 354 provide electrolyte solution with metal ions from an anode (not shown) which is subsequently removed by return lines 356. Similarly, supply and return lines 358 and 360, respectively supply and return rinsing water. Supply lines 350, 354, and 358 may be appropriately pressurized to provide the ability to adjust flow rates; while suction may be applied to return lines 352, 356 and 358. One skilled in the art would understand how to adjust the area, pressure and flow rates of outlets and inlets of supply and return lines and slots (see, e.g., FIG. 2) to achieve a desired flow.

Although a batch process has been illustratively described, the present invention is amenable to a continuous line operation. Such continuous line operation would greatly minimize handling of glass plates and would result in a much lower manufacturing cost. Further, the present invention has been illustratively described for gate lines for liquid crystal display devices; however, the present invention is much broader and has application to any electroplating process. It is to be understood that the present invention is applicable to forming electroplated metal on any conductive structure including but not limited to gate lines. For example, data lines, capacitor electrodes, contacts, light shields or other structures for other semiconductor devices may be electroplated in accordance with the present invention.

Now the additional process steps will be described for a four mask process sequence for forming a TFT array for a liquid crystal display device. Referring to FIGS. 6A and 6B, a trilayer insulator 20 is deposited over pixel electrodes 16 and metal layer 18. Tri-layer insulator 20 may include a layer of silicon nitride 22 followed by a layer of amorphous silicon (a-Si) 24. Tri-layer insulator 20 preferably includes a silicon nitride layer 26 patterned over a channel (over gate line 14). Silicon nitride layer 26 may be defined by a combination of back and front side resist exposures to self align silicon nitride layer 26 to gate line 14. Silicon nitride layer 26 is etched to expose the amorphous silicon 24.

Figure 8A:
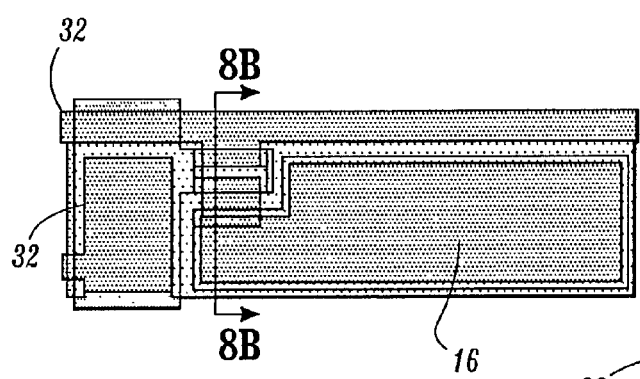
FIG. 8A is a top view of the single pixel cell of FIG. 7A having an a data metal applied and patterned in accordance with the present invention.
Figure 8B:
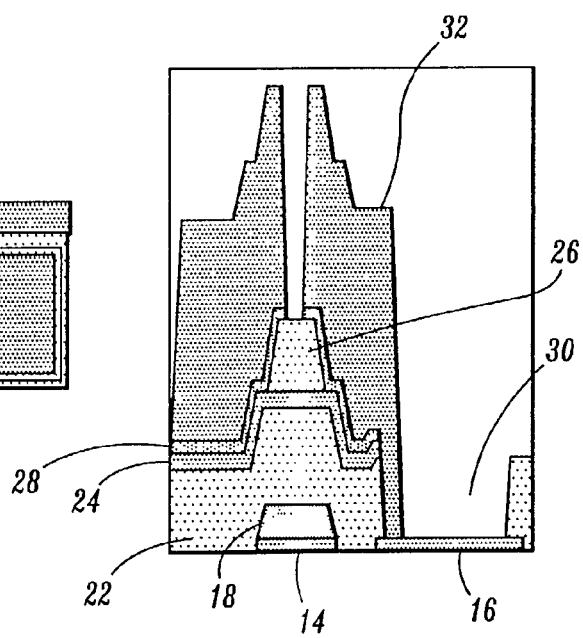
FIG. 8B is a cross-sectional view of the pixel cell taken at section line 8B—8B of FIG. 8A in accordance with the present invention.

Referring to FIGS. 7A and 7B, a highly doped n+ microcrystalline layer 28 is deposited over layers 24 and 26. Vias 30 are etched down to pixel electrodes 16 in the array area and down to gate metal outside the array area. Referring to FIGS. 8A and 8B, data metal 32 is deposited and patterned to complete the TFT array. Data metal 32 preferably includes a Mo/Al/Mo metal layer. Thin film transistors 38 are formed which are enabled by gate 14 to form a channel in layer 24. Contacts (not shown) may be formed directly between the gate metal and data metal through via openings formed during via formation as described for FIGS. 7A and 7B. If a data metal etchant attacks gate metal (14 or 18), the gate metal (14 or 18) can advantageously be covered by data metal 32 where there is a via opening in the gate insulator 22.

One significant advantage of electroplating over electroless deposition is that the metal purity (and hence conductivity) is better, additives can be used to modify the edge profile, and the stress can be lower. Additionally, the current flow can be monitored to determine how much metal has been deposited in a given area and this value may be employed in a feed-back loop to control the metal thickness along the lines. In fact, a non-uniform metal thickness along the line could be used if desired.

The present invention may be employed in other structures as well, for example, in a four mask top gate TFT device. Referring to FIGS. 9A and 9B, a first step may include deposition and patterning of a light shield layer 102 on a substrate 104. Light shield layer 102 may include Cr—$Cr_xO_y$ cermet or other opaque materials. Substrate 104 may include glass, quartz, a polymer or other transparent material. Light shield layer 102 is overcoated with an insulator 106, which may include a silicon oxide, a silicon nitride or an organic dielectric.

Referring to FIGS. 10A and 10B, deposition and patterning of a data metal 108, followed by an N+ treatment, is performed. Data metal 108 is etched to form a tapered edge. Referring to FIGS. 11A and 11B, an a-Si layer 110 and a gate insulator 112 are deposited. a-Si layer 110 and gate insulator 112 are patterned by a back exposure and an etch process which gives tapered edges.

Referring to FIGS. 12A and 12B, a transparent conducive layer 114 (e.g., ITO or IZO) is deposited and patterned by lithography or other means such as microcontact printing. A metal layer 116 is electroplated on layer 114 in accordance with the present invention. Metal layer 114 may include, for example, Ni, Co, Au, Ag, Cu, and/or alloys of these metals. Thin film transistors 36 are formed which are enabled by gate 114 to form a channel in layer 110.

Figure 14:
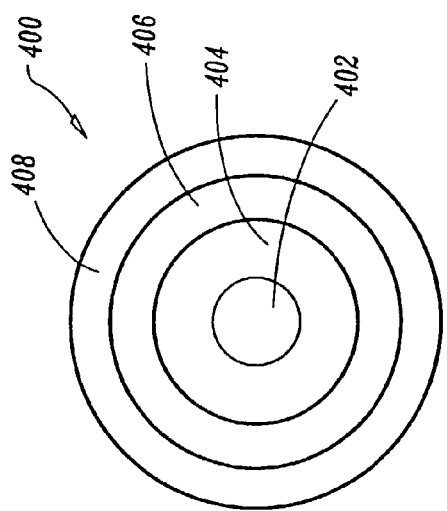
FIG. 14 is a top view of the nozzle of FIG. 13 in accordance with the present invention.
Figure 13:
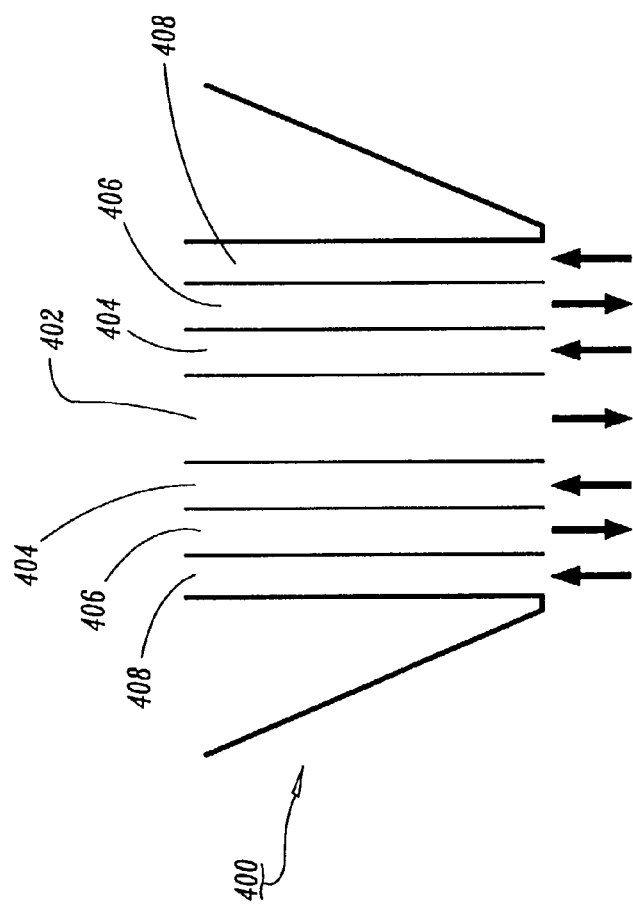
FIG. 13 is a cross-sectional view of an annular nozzle having the capability of scanning in two directions to perform electroplating in accordance with the present invention.

Referring to FIG. 13, a cross-sectional view of an annular nozzle 400 is shown. Annular nozzle 400 is capable of scanning in two directions (e.g., x and y directions). This may be particularly useful for electroplating between small features or features that are not parallel, such as, for example, wiring between a TFT array and other electronic devices. Nozzle 400 provides added flexibility to the plating process in accordance with the invention. In the embodiment shown in FIGS. 13 and 14, nozzle 400 includes four flow ducts. FIG. 14 shows a top view of nozzle 400.

Referring now to FIGS. 13 and 14, an inner tube 402 is included for electrolyte delivery. A first annulus 404 is employed for withdrawal of the electrolyte. A second annulus 406 and a third annulus 408 may be employed for delivery and withdrawal of a rinse solution. Other configurations of electrolyte/solution flow and the number of annuli are also contemplated. Other embodiments may include a plurality of tubes arranged circumferentially about a center tube or tubes. A plurality of tubes may replace one or more of the annuli. In addition, the inner tube and the outer flow conduits may include rectangular or other shaped cross-sections. An anode is preferably placed in inner tube 402 or incorporated into the walls of inner tube 402 or forms the walls of inner tube 402 or other annuli.

Having described preferred embodiments of an electroplating apparatus and four mask TFT array process with electroplated metal (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming an electroplated metal on conductive layers comprising the steps of:

providing a substrate having elongated conductive structures formed thereon;

providing an electroplating apparatus including a plurality of chambers, a first chamber including an anode therein, the first chamber including a first opening for delivering an electrolytic solution containing metal ions onto the conductive structures to be electroplated, the conductive structures being a cathode, and a second chamber formed adjacent to the first chamber and having a second opening in proximity of the first opening for removing electrolytic solution containing metal ions from the conductive structures to be electroplated, wherein the first chamber is surrounded by the second chamber; and moving the plurality of chambers in a first direction along the conductive structures to be electroplated to electroplate the metal ions onto the conductive structures.

2. The method as recited in claim 1, wherein the plurality of chambers includes a rinse chamber and the method further includes the step of rinsing an electroplated surface of the conductive structures.

3. The method as recited in claim 1, wherein the plurality of chambers includes a pretreatment chamber which leads the first chamber and further comprising the steps of pretreating and cleaning the conductive structures to be electroplated.

4. The method as recited in claim 1, wherein the conductive structures include gate lines for active devices.

5. The method as recited in claim 4, wherein the conductive structures extend longitudinally along the first direction.

6. The method as recited in claim 5, wherein the conductive structures connect to a common node during electroplating.

7. The method as recited in claim 1, wherein the electroplating apparatus includes a plurality of first chambers and a plurality of second chambers and further comprising the step of incrementally electroplating the conductive structures with each of the plurality of first chambers.

8. The method as recited in claim 1, wherein the anode includes a consumable metal anode.

9. The method as recited in claim 1, wherein the anode includes an inert metal and the electrolyte solution includes metal ions to be deposited.

10. The method as recited in claim 1, wherein the step of providing includes the step of providing the apparatus in which the first chamber is surrounded by the second chamber.

11. A method for fabricating an active array for a liquid crystal display device comprising the steps of:
   forming addressing lines for the active array;
   providing an electroplating apparatus including a plurality of chambers, a first chamber for receiving an electrolytic solution, the first chamber including an anode which is disposed within the first chamber, the first chamber including a first opening for delivering the electrolytic solution containing metal ions onto the addressing lines to be electroplated, the addressing lines being a cathode, and a second chamber formed adjacent to the first chamber and having a second opening in proximity of the first opening for removing electrolytic solution containing metal ions from the addressing lines to be electroplated, wherein the first chamber is surrounded by the second chamber; and
   moving the plurality of chambers in a first direction along the addressing lines to be electroplated to electroplate the metal ions onto the addressing lines.

12. The method as recited in claim 11, wherein the plurality of chambers includes a rinse chamber and the method further includes the step of rinsing an electroplated surface of the addressing lines.

13. The method as recited in claim 11, wherein the plurality of chambers includes a pretreatment chamber which leads the first chamber and further comprising the steps of pretreating and cleaning the addressing lines to be electroplated.

14. The method as recited in claim 11, wherein the addressing lines include one of indium tin oxide and indium zinc oxide.

15. The method as recited in claim 14, wherein the addressing lines extend longitudinally along the first direction.

16. The method as recited in claim 14, wherein the addressing lines connect to a common node during electroplating.

17. The method as recited in claim 11, wherein the electroplating apparatus includes a plurality of first chambers and a plurality of second chambers and further comprising the step of incrementally electroplating the addressing lines with each of the plurality of first chambers.

18. The method as recited in claim 11, wherein the anode includes a consumable metal anode.

19. The method as recited in claim 11, wherein the anode includes an inert metal and the electrolyte solution includes metal ions to be deposited.

20. The method as recited in claim 11, further comprising the steps of:
   forming access devices for accessing pixel electrodes through the addressing lines; and
   forming data lines for addressing the pixel electrodes.

21. The method as recited in claim 11, wherein the addressing lines are included in a top gate structure.

22. The method as recited in claim 11, wherein the addressing lines are included in a bottom gate structure.

23. The method as recited in claim 11, wherein the method is performed in only four masking steps.

24. The method as recited in claim 11, further comprising the step of:
   forming access devices for accessing pixel electrodes through gate lines, the addressing lines for addressing the pixel electrodes.

25. The method as recited in claim 11, wherein the active array includes conductive structures isolated from the cathode such that electroplating is prevented on the conductive structures.

26. The method as recited in claim 25, wherein the conductive structures include pixel electrodes.

* * * * *